(12) United States Patent
Hussein et al.

(10) Patent No.: US 11,909,406 B1
(45) Date of Patent: Feb. 20, 2024

(54) RING OSCILLATOR PHASE-LOCKED LOOP WITH DIGITAL PHASE NOISE SUPPRESSION

(71) Applicant: Apple Inc., Cupertino, CA (US)

(72) Inventors: Ahmed I Hussein, San Jose, CA (US); Mahdi Forghani, Los Angeles, CA (US); David M Signoff, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/893,471

(22) Filed: Aug. 23, 2022

(51) Int. Cl.
   *H03L 7/099* (2006.01)
   *H03L 7/093* (2006.01)

(52) U.S. Cl.
   CPC ............ *H03L 7/0995* (2013.01); *H03L 7/093* (2013.01)

(58) Field of Classification Search
   CPC ... G04F 10/005; G04F 10/00; H03L 2207/50; H03L 2207/00; H03L 7/08; H03L 7/0995; H03L 7/107
   See application file for complete search history.

(56) References Cited

U.S. PATENT DOCUMENTS

| | | | |
|---|---|---|---|
| 7,928,888 B1 * | 4/2011 | Chiu ..................... | G04F 10/005 |
| | | | 341/161 |
| 8,315,575 B2 | 11/2012 | Puma et al. | |
| 9,112,517 B1 * | 8/2015 | Lye ........................ | H03L 7/185 |
| 9,170,564 B2 | 10/2015 | Sato | |
| 9,237,004 B2 * | 1/2016 | Lin ......................... | H03L 7/095 |

FOREIGN PATENT DOCUMENTS

EP    3059866 A1    8/2016

* cited by examiner

*Primary Examiner* — Diana J. Cheng
(74) *Attorney, Agent, or Firm* — Treyz Law Group; Jason Tsai

(57) ABSTRACT

An electronic device may include wireless circuitry having mixer circuitry configured to receive an oscillator signal from phase-locked loop circuitry. The phase-locked loop circuitry may include a digital or analog phase-locked loop having a first frequency divider, a ring oscillator, and an auxiliary phase noise cancellation loop coupled to the ring oscillator. The auxiliary phase noise cancellation loop may include at least a time-to-digital converter, a second frequency divider, an amplifier, and a bandpass filter configured to reject thermal and quantization noise associated with the time-to-digital converter. The first frequency divider may have a first division ratio, whereas the second frequency divider may have a second division ratio that is less than the first division ratio to provide faster phase noise correction.

19 Claims, 10 Drawing Sheets

US 11,909,406 B1

RING OSCILLATOR PHASE-LOCKED LOOP WITH DIGITAL PHASE NOISE SUPPRESSION

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to receive and transmit radio-frequency signals.

Signals received by the antennas are fed through a transceiver, which can include a mixer for demodulating the radio-frequency signals. The mixer can receive a local oscillator signal from a phase-locked loop. It can be challenging to design a satisfactory phase-locked loop for an electronic device.

SUMMARY

An electronic device may include wireless circuitry. The wireless circuitry may a mixer that can receive an oscillator signal from a phase-locked loop (PLL). The phase-locked loop can be a digital phase-locked loop or an analog phase-locked loop. A digital phase-locked loop can include a main phase-locking loop that includes a time-to-digital converter, a digital loop filter, a ring oscillator, and a frequency divider. An analog phase-locked loop can include a main phase-locked loop that includes a phase frequency detector, a charge pump, an analog loop filter, a ring oscillator and a frequency divider. Both the digital PLL and the analog PLL can include an auxiliary digital loop coupled to the ring oscillator, the auxiliary digital loop configured to reduce the phase noise associated with the ring oscillator.

An aspect of the disclosure provides phase-locked loop (PLL) circuitry that includes a first time-to-digital converter, a digital filter coupled to an output of the first time-to-digital converter, a ring oscillator coupled to an output of the digital filter, a first frequency divider coupled between an output of the ring oscillator and an input of the first time-to-digital converter, a second frequency divider coupled to the output of the ring oscillator, and a second time-to-digital converter coupled an output of the second frequency divider. The first frequency divider can have a first division ratio, and the second frequency divider can have a second division ratio less than the first division ratio.

As an example, the PLL circuitry can further include an amplifier coupled to an output of the second time-to-digital converter, a bandpass filter coupled to an output of the amplifier, and an adder having a first input coupled to the digital filter, a second input coupled to the bandpass filter, and an output coupled to the ring oscillator. The bandpass filter can have a passband configured to reject thermal and quantization noise associated with the second time-to-digital converter. The ring oscillator can be variable ring oscillator having an adjustable oscillation frequency. As another example, the PLL circuitry have further include an amplifier having an input coupled to an output of the second time-to-digital converter, a bandpass filter coupled to an output of the amplifier, a sigma delta modulator coupled to an output of the bandpass filter, and an adjustable delay circuit having inputs coupled to the ring oscillator and the sigma delta modulator.

An aspect of the disclosure provides phase-locked loop (PLL) circuitry that includes a phase frequency detector, charge pump and filter circuitry coupled to an output of the phase frequency detector, a ring oscillator coupled to an output of the charge pump and filter circuitry, a first frequency divider coupled between an output of the ring oscillator and an input of the phase frequency detector, a second frequency divider coupled to the output of the ring oscillator; and a time-to-digital converter coupled to an output of the second frequency divider. The first frequency divider has a first division ratio, and the second frequency divider can have a second division ratio less than the first division ratio. As an example, the PLL circuitry can further include a digital-to-analog converter coupled to an output of the time-to-digital converter, a variable gain amplifier coupled to an output of the digital-to-analog converter, and a bandpass filter having an input coupled to an output of the variable gain amplifier and having an output coupled to the ring oscillator. As another example, the PLL circuitry can further include an amplifier coupled to an output of the time-to-digital converter, a bandpass filter coupled to an output of the amplifier, a digital-to-analog converter coupled to an output of the bandpass filter, and an adder having a first input coupled to the charge pump and filter circuitry, a second input coupled to the digital-to-analog converter, and an output coupled to the ring oscillator.

An aspect of the disclosure provides circuitry that includes a phase-locked loop having a ring oscillator and a first frequency divider with a first frequency division ratio that is used to generate the oscillator signal and a phase noise cancellation loop coupled to the ring oscillator and having a second frequency divider with a second frequency division ratio that is less than the first frequency division ratio. The phase noise cancellation loop can include a time-to-digital converter configured to receive signals from the second frequency divider, an amplifier configured to amplify signals output from the time-to-digital converter, and a bandpass filter configured to filter signals output from the amplifier.

DETAILED DESCRIPTION

Figure 1:
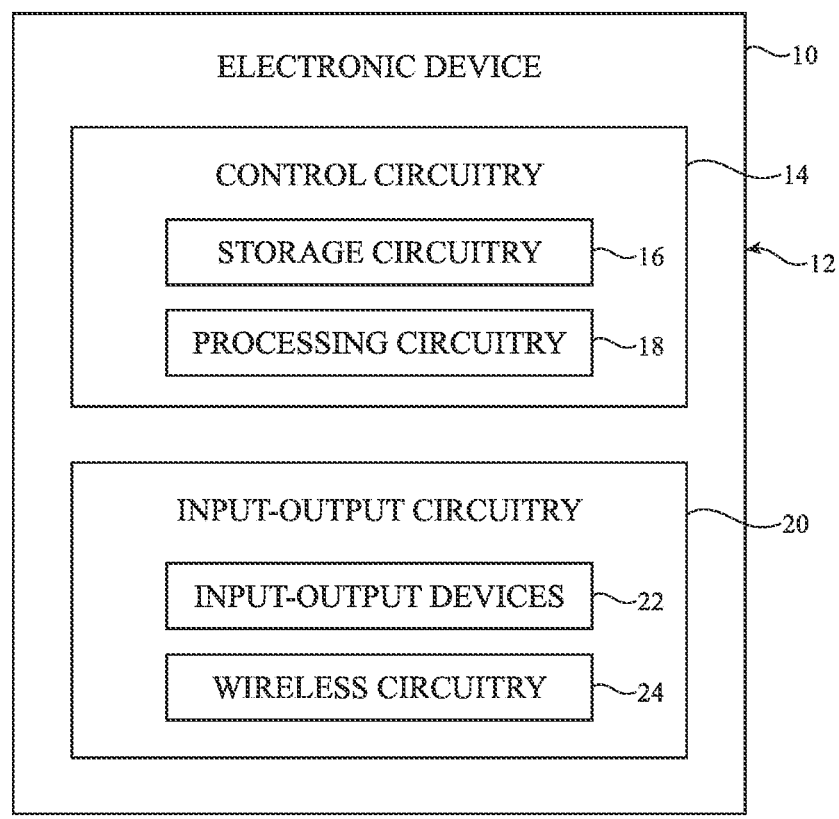
FIG. 1 is a diagram of an illustrative electronic device having wireless circuitry in accordance with some embodiments.

An electronic device such as electronic device 10 of FIG. 1 may be provided with wireless circuitry. The wireless circuitry may include phase-locked loop (PLL) circuitry configured to generate one or more local oscillator signals. The PLL circuitry may be implemented as a digital PLL circuit or an analog PLL circuit. The PLL circuitry can include a ring oscillator and a first frequency divider having a first division ratio coupled together in a main (primary) phase-locked loop. The PLL circuitry can further include an auxiliary digital loop configured to reduce the phase noise of the ring oscillator. The ring oscillator may be disposed in a forward path of the auxiliary digital loop. The auxiliary digital loop can further include a second frequency divider, a time-to-digital converter, an amplifier, a bandpass filter, and optionally a data converter. The second frequency divider can have a second division ratio that is substantially less than the first division ratio. Having a smaller division ratio enables the auxiliary digital loop to correct the phase noise of the ring oscillator much faster than the than the cycle time of the main phase-locked loop. Configured and operated in this way, a ring-oscillator based PLL can exhibit improved phase noise performance.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
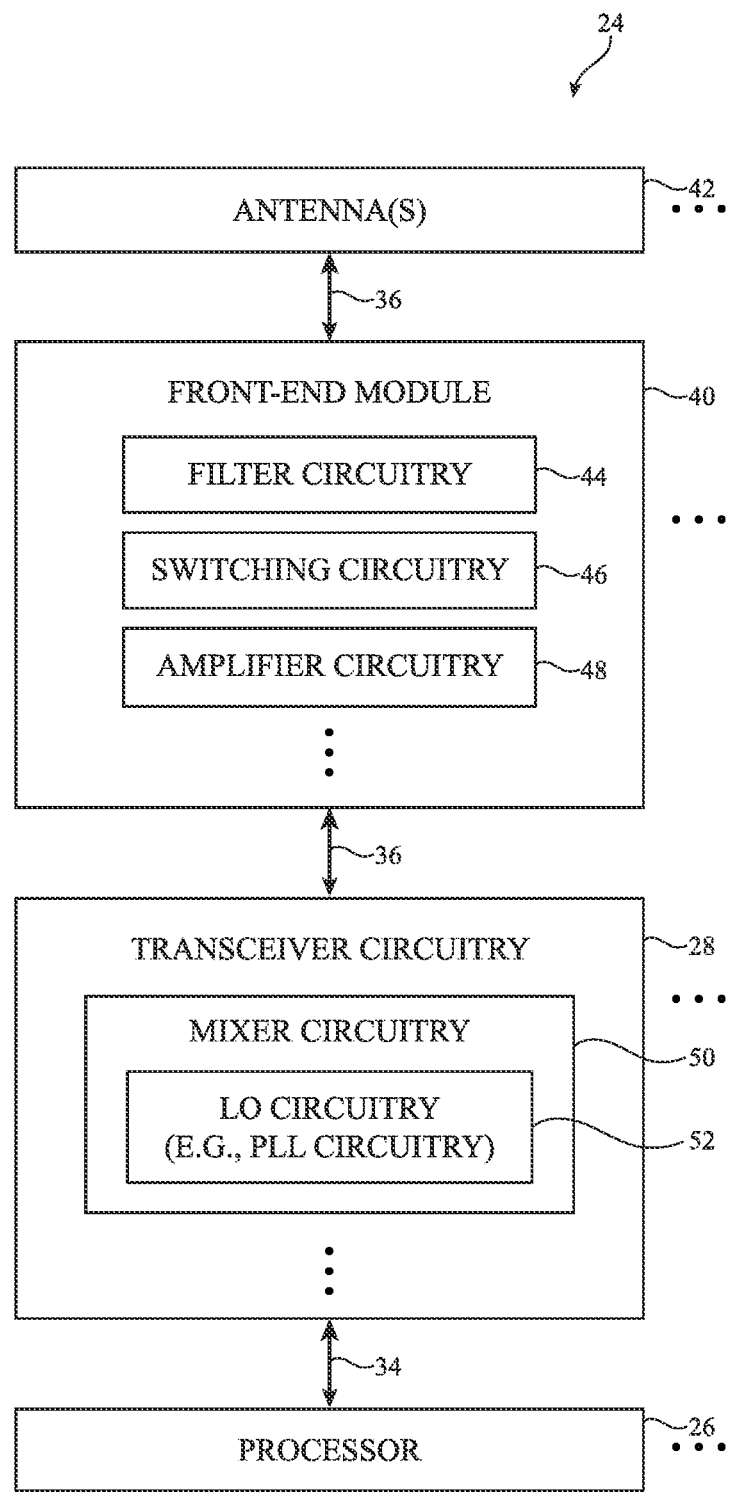
FIG. 2 is a diagram of illustrative wireless circuitry having transceiver circuitry in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital baseband signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for down-converting (or demodulating) the received radio-frequency signals to baseband frequencies prior to conveying the received signals to processor 26 over path 34. Mixer circuitry 50 can include local oscillator (LO) circuitry such as a local oscillator circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies. Device configurations in which LO circuitry 52 is implemented using phase-locked loops are sometimes described as an example herein.

Figure 3:
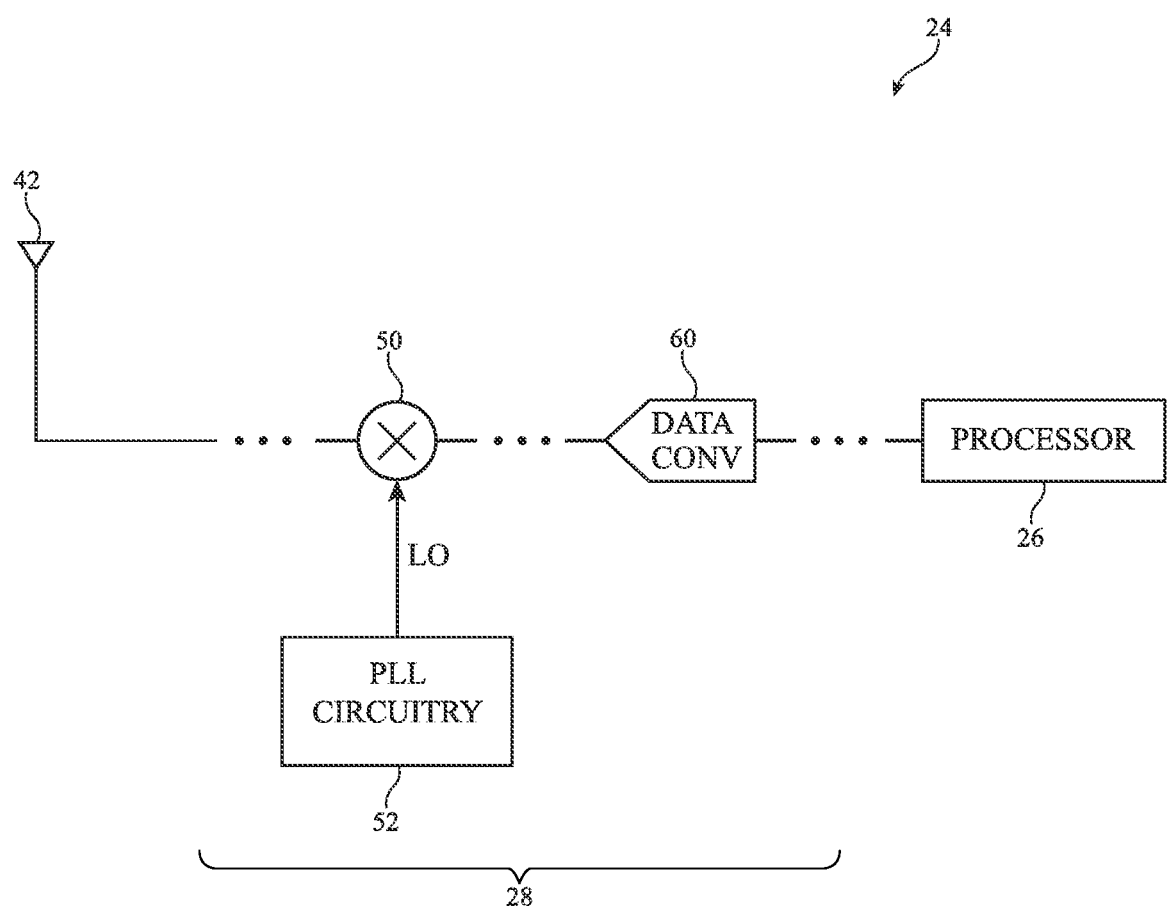
FIG. 3 is a diagram of illustrative wireless circuitry having a mixer configured to receive a local oscillator signal from phase-locked loop (PLL) circuitry in accordance with some embodiments.

FIG. 3 is a diagram of wireless circuitry 24 showing transceiver 28 coupled between antenna 42 and processor 26. In general, one or more circuit components (e.g., circuits within front-end module 40 shown in FIG. 2 or other radio-frequency components) may be interposed between antenna 42 and transceiver 28. Similarly, one or more circuit components may be interposed between transceiver 28 and processor 26. Transceiver 28 may include one or more mixers such as mixer 50. Mixer 50 may be configured to modulate (or demodulate) between a radio frequency and a baseband frequency or an intermediate frequency that is less than the radio frequency. Transceiver 28 may also include a data converting circuit such as an analog-to-digital converter and/or a digital-to-analog converter configured to convert signals between an analog domain and a digital domain (e.g., signals interfacing with the mixers are in the analog domain, whereas signals interfacing with processor 26 are in the digital domain). Mixer 50 may be configured to receive a local oscillator signal LO from a local oscillator signal generator such as phase-locked loop (PLL) circuitry 52.

Figure 4:
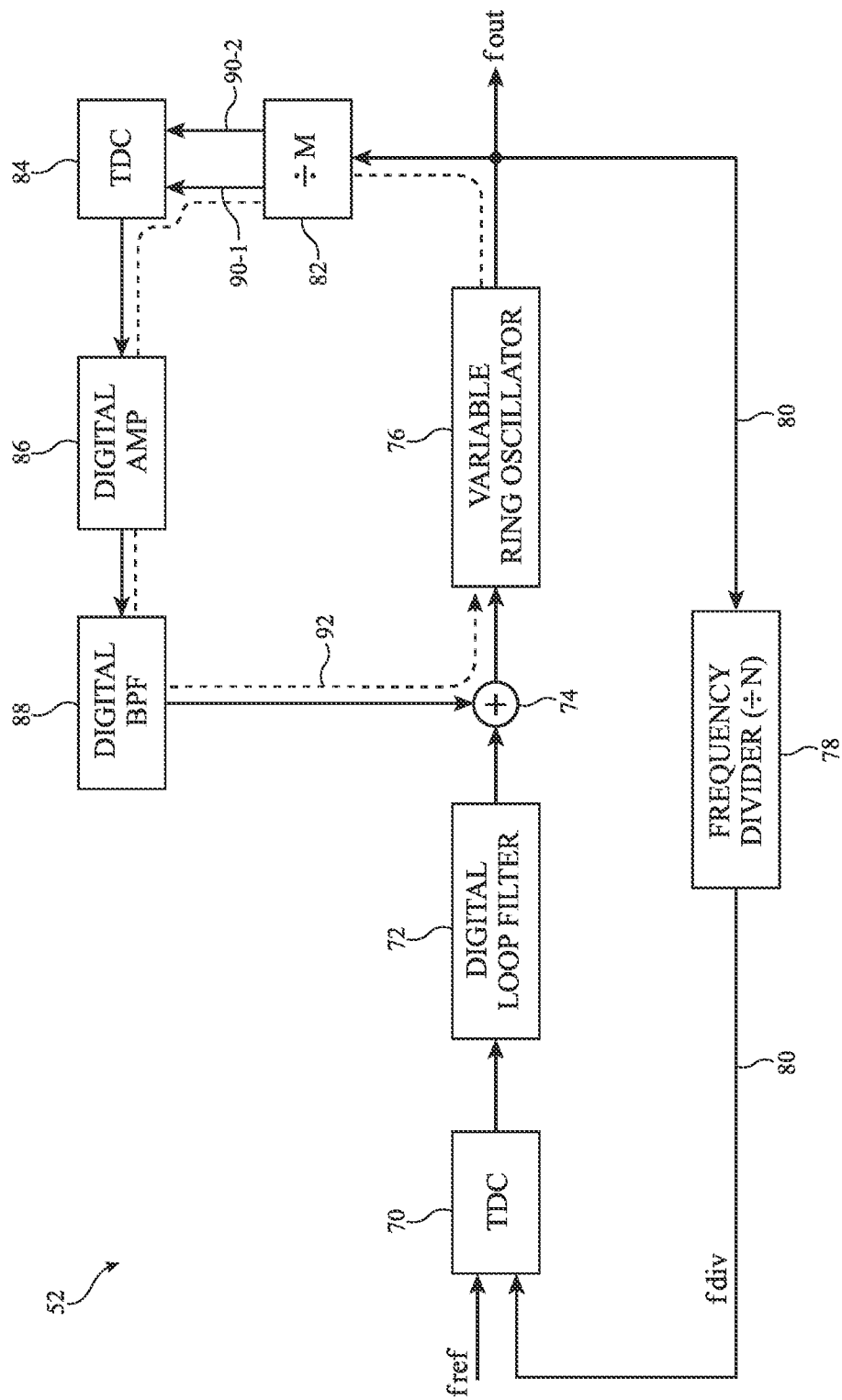
FIG. 4 is a diagram of illustrative digital phase-locked loop circuitry having a ring oscillator and an auxiliary digital loop for reducing the phase noise of the ring oscillator in accordance with an embodiment.

FIG. 4 is a diagram of illustrative PLL circuitry 52 in accordance with an embodiment. A shown in FIG. 4, PLL circuitry 52 may include a time-to-digital converting circuit such as time-to-digital converter (TDC) 70, a filter circuit such as a digital loop filter 72, a ring oscillator (RO) circuit such as variable ring oscillator 76, and a frequency division circuit such as frequency divider 78 coupled together in a loop (sometimes referred to as the main or primary loop). Time-to-digital converter 70 may have a first input configured to receive a reference clock signal with a reference clock frequency fref, a second input configured to receive a feedback clock signal with a divided clock frequency fdiv, and an output on which a digital signal that is proportional to the phase/time difference of the reference and feedback clock signals can be generated. Time-to-digital converter 70 may, for example, generate a digital signal that is proportional to the time interval between rising edges of the reference and feedback clocks or between the falling edges of the reference and feedback clocks.

The digital loop filter 72 may be configured to receive the digital signal from the output of the time-to-digital converter 70 and to output a corresponding filtered digital signal (e.g., a filtered binary code). Variable ring oscillator 76 may include an input coupled to digital loop filter 72 and may include an output on which an output clock signal having output clock frequency fout is generated. PLL circuitry 52 that includes a ring oscillator such as variable ring oscillator 76 is sometimes referred to as a ring oscillator based phase-locked loop. A ring oscillator can be defined herein as an oscillator having an odd number of inverters connected in a ring.

Frequency divider 78 may have an input coupled to the output of variable ring oscillator 76 and an output coupled to the second input of time-to-digital converter 70, as shown by feedback path 80. Connected in a loop in this way, phase-locked loop circuitry 52 will generate an output clock signal with frequency fout while ensuring that the phase difference between the two clock signals at the inputs of TDC 70 are minimized (e.g., the primary PLL loop is configured to minimize the phase difference between the reference clock signal and the feedback clock signal).

In general, the PLL output frequency fout is equal to fref*N, where N is the frequency division ratio of divider 78. For example, frequency division ratio N of divider 78 can be greater than 10, greater than 20, greater than 40, greater than 60, greater than 80, 20-100, 80-120, 60-140, or at least 100. Reference clock frequency fref may be in the Megahertz or Gigahertz frequency range (e.g., fref may be 1-10 MHz, 10-100 MHz, at least 100 MHz, 100 MHz to 1 GHz, less than 1 GH, 0.1 GHz, 0.5 GHz, 0.1-1 GHz, etc.). Thus, in an example where reference clock frequency fref is equal to 80 MHz and the divisional ratio is equal to 100, the output clock frequency fout will be equal to 8 GHz (i.e., 80 MHz multiplied by 100).

A phase-locked loop implemented using a time-to-digital converter (TDC), a digital loop filter, and an LC oscillator or a ring oscillator is sometimes referred to as a digital phase-locked loop. In contrast, conventional analog phase-locked loops can include a phase frequency detector, a charge pump, an analog loop filter, and an LC oscillator (i.e., an LC-based voltage controlled oscillator). LC-based voltage controlled oscillators have inductor and capacitor components. The inductor and capacitor components in an LC oscillator, however, can occupy a significant amount of chip area. In accordance with some embodiments, a ring oscillator (e.g., a digital circuit that does not include any large passive components) can be used instead of an LC-based voltage controlled oscillator to substantially reduce the amount of area of a phase-locked loop. Relative to LC-based voltage controlled oscillators, ring oscillators such as ring oscillator 76 in PLL circuitry 52 can exhibit higher levels of phase noise.

To help reduce or suppress the phase noise of ring oscillator 76, PLL circuitry 52 may be provided with an auxiliary loop such as loop 92 shown in FIG. 4. Ring oscillator 76 may be disposed in a forward path of the auxiliary loop 92. Auxiliary loop 92 may further include a frequency division circuit such as frequency divider 82, a time-to-digital conversion circuit such as time-to-digital converter (TDC) 84, an amplifier such as digital amplifier 86, a filter circuit such as digital bandpass filter 88, and an adder circuit such as adder 74.

Frequency divider block 82 may include one or more separate frequency divider subcircuits configured to receive the PLL output clock signal having frequency fout and configured to output a first clock signal having a first phase on a first output path 90-1 and to output a second clock signal having a second phase different than the first phase on a second output path 90-2. Frequency divider 82 may have a frequency division ratio M that is less than frequency division ratio N of frequency divider 78. As an example, the frequency division ratio M of divider 82 may be equal to or less than $1/10^{th}$ of the frequency division ratio N of divider 78 (e.g., division ratio N can be 100 while division ratio is equal to 10).

As other examples, frequency division ratio M can be equal to or less than ½ of frequency division ratio N, frequency division ratio M can be equal to or less than ⅓ of frequency division ratio N, frequency division ratio M can be equal to or less than ¼ of frequency division ratio N, frequency division ratio M can be equal to or less than ⅕ of frequency division ratio N, frequency division ratio M can be equal to or less than ⅙ of frequency division ratio N, frequency division ratio M can be equal to or less than 1/7 of frequency division ratio N, frequency division ratio M can be equal to or less than ⅛ of frequency division ratio N, frequency division ratio M can be equal to or less than 1/9 of frequency division ratio N, frequency division ratio M can be equal to or less than 1/10 to 1/20 of frequency division ratio N, frequency division ratio M can be equal to or less than 1/10 to 1/100 of frequency division ratio N, or ratio N can be 5-100 times or more greater than ratio M. Using a smaller division ratio M in the auxiliary loop 92 enables loop 92 to correct or cancel out the phase noise of ring oscillator 76 much faster than the correction speed of the primary PLL loop, which is set by division ratio N.

Time-to-digital converter 84 may receive the frequency divided clock signals from paths 90-1 and 90-2. TDC 84 may operate as a phase detector to output a corresponding phase error signal based on the phase difference between the two received clock signals at its inputs. Digital amplifier 86 may be configured to amplify the detected phase error signal to produce an amplified phase error signal. Digital amplifier 86 may provide an amount of gain that determines the loop gain of auxiliary loop 92.

Figure 6:
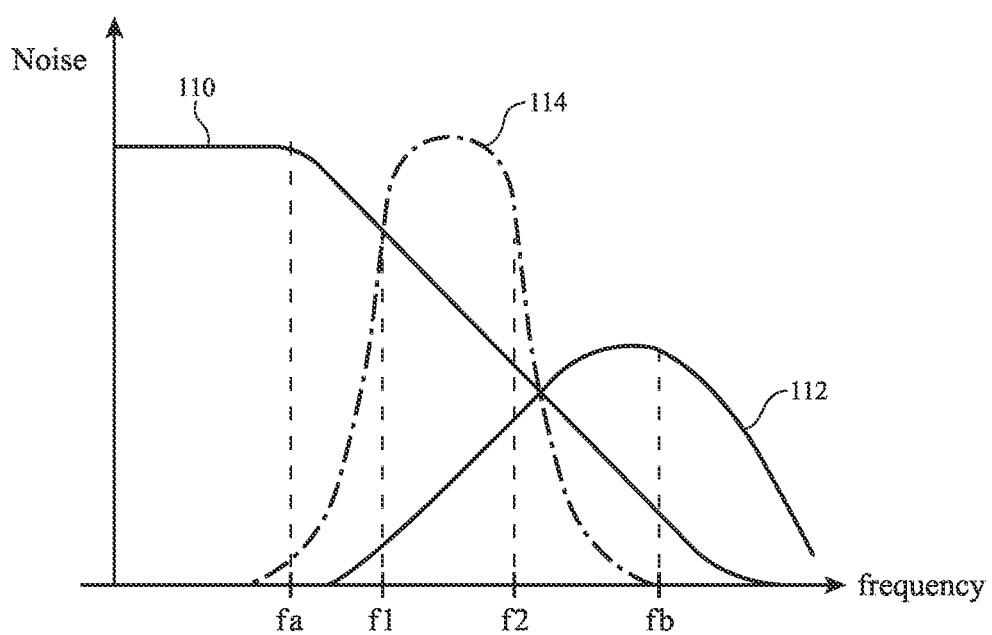
FIG. 6 is a diagram showing an illustrative bandpass filter response for suppressing noise associated with a time-to-digital converter in accordance with some embodiments.
Figure 7:
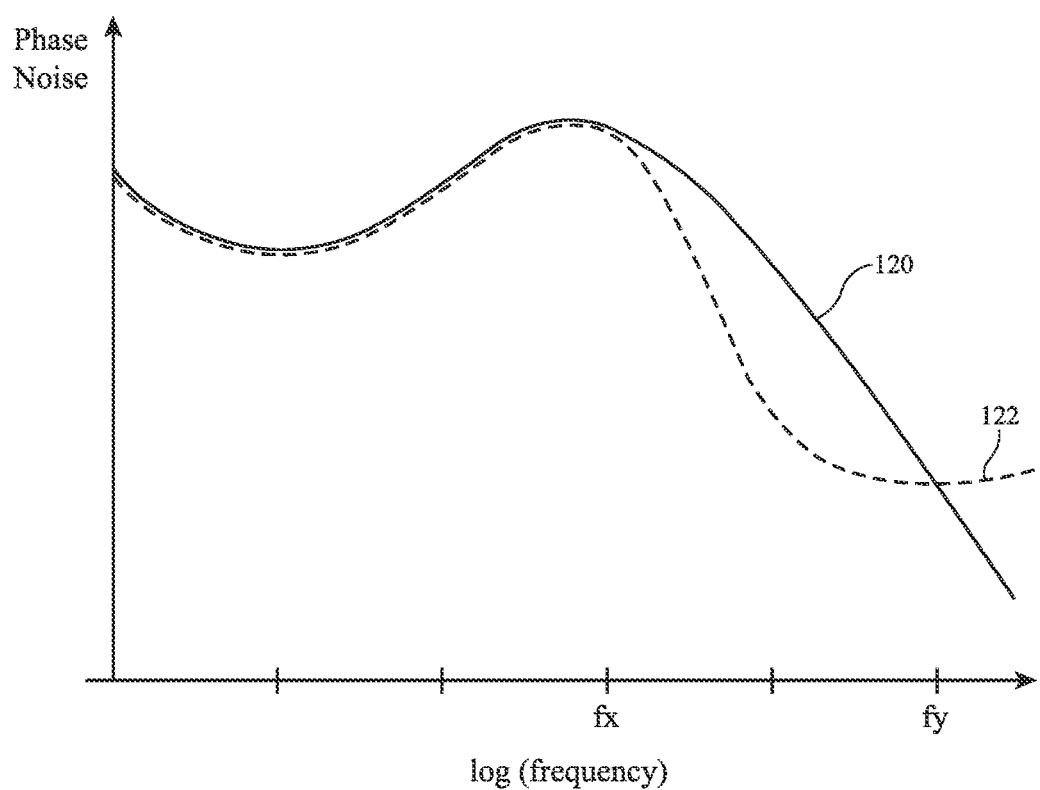
FIG. 7 is a plot showing how the phase noise of phase-locked loop circuitry can be reduced using an auxiliary digital loop in accordance with some embodiments.

Digital bandpass filter 88 may be configured to filter the amplified phase error signal to produce a filtered phase error signal. Digital bandpass filter 88 may be configured to filter out undesired noise signals associated with time-to-digital converter 84. FIG. 6 is a diagram showing an illustrative bandpass filter response for suppressing noise associated with time-to-digital converter 84. In FIG. 6, curve 110 represents a thermal noise profile of TDC 84, whereas curve 112 represents a quantization noise profile of TDC 84. The TDC thermal noise curve 110 may roll off around frequency fa. The TDC quantization noise curve 112 may have a peak around frequency fb. The filter response 114 of bandpass filter 88 can be designed to have a passband from frequency f1 to frequency f2, where f1 is greater than fa but less than f2 and where f2 is less than fb. Selecting a filter passband from f1 to f2 in this way can help reject the thermal and quantization noise associated with time-to-digital converter 84.

Adder 74 may have a first input configured to receive a filtered signal from digital loop filter 72, a second input configured to receive the filtered phase error signal from digital bandpass filter 88, and an output coupled to variable ring oscillator 76. Adder 74 may optionally be configured to subtract the filtered phase error signal from the filtered signal received from loop filter 72. Adder 74 may therefore sometimes be referred to as a subtraction circuit or a difference circuit. Auxiliary loop 92 that controls or tunes variable ring oscillator 76 in this way is therefore a negative feedback loop.

Figure 5:
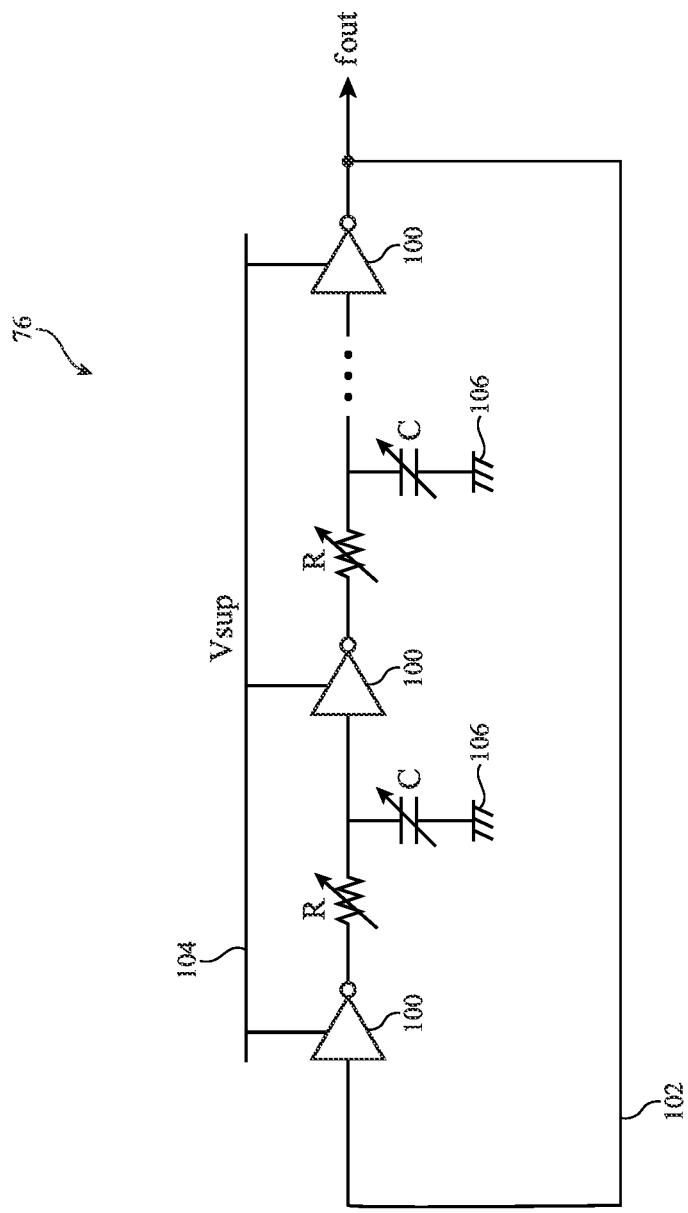
FIG. 5 is a diagram of an illustrative variable ring oscillator in accordance with some embodiments.

The signal output from circuit 74 can be used to control or adjust (tune) variable ring oscillator 76. FIG. 5 shows one illustrative circuit implementation of variable ring oscillator 76. As shown in FIG. 5, variable ring oscillator 76 may include a chain of inverters 100 coupled together in a ring. Each inverter 100 may have an output that is coupled to a tunable resistor R and a tunable capacitor C. Tunable resistor R may be coupled in series between the output of an inverter 100 and the input of a succeeding inverter 100. Tunable capacitor C may be shunted between a tunable resistor R and a ground line 106 (e.g., a ground power supply terminal on which a ground voltage is provided). Each inverter 100 may be coupled to a positive power supply line 104 configured to receive positive power supply voltage Vsup. Ring oscillator 76 may include an odd number of inverters 100. The last inverter 100 in the chain may have an output that is coupled to the input of the first inverter 100 in the chain via feedback path 102. In general, the control signal output from circuit 74 can be used to tune one or more of adjustable resistance R within oscillator 76, one or more of adjustable capacitance C within oscillator 76, and/or supply voltage Vsup of one or more of inverters 100 within oscillator 76. These ring oscillator tuning knobs for adjusting the oscillation frequency of variable oscillator 76 described above are illustrative. If desired, variable ring oscillator 76 can be provided with other or additional forms of programmability to tune its oscillation frequency.

Figure 9:
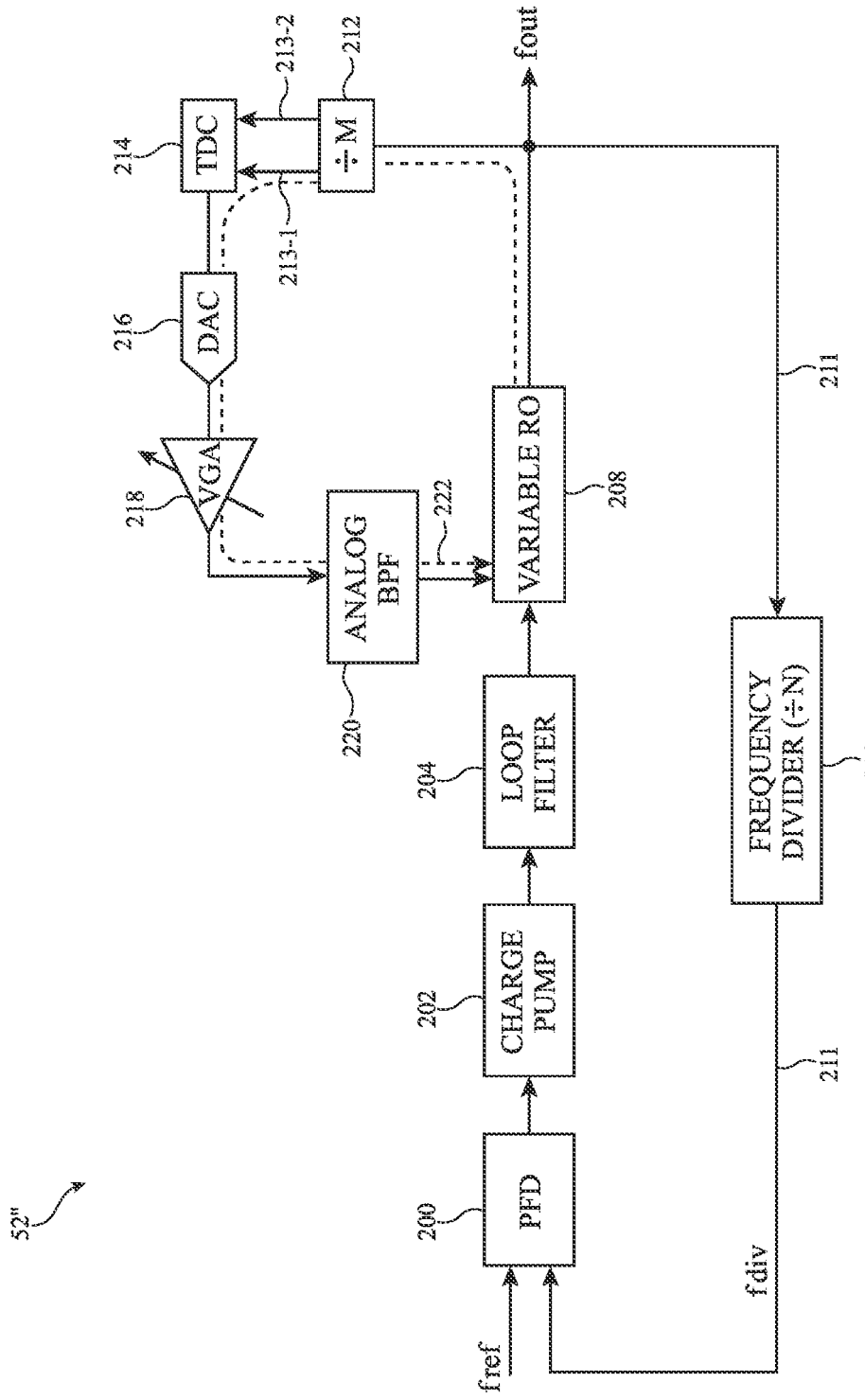
FIG. 9 is a diagram of illustrative analog phase-locked loop circuitry having a ring oscillator and an auxiliary digital loop with an analog bandpass filter in accordance with an embodiment.

Configured and operated in this way, auxiliary loop 92 can be used to reduce the phase noise of ring oscillator 76, which can help improve the phase noise performance of the overall PLL circuitry 52. FIG. 9 is a plot showing how the phase noise of phase-locked loop circuitry 52 can be reduced using auxiliary loop 92. In FIG. 9, curve 120 represents the phase noise profile of a conventional phase-locked loop without auxiliary loop 92, whereas curve 122 represents the phase noise profile of PLL circuitry 52 that includes auxiliary loop 92. As shown in FIG. 9, curve 122 exhibits a lower amount of phase noise relative to curve 120 in a certain frequency range (e.g., from frequency fx to frequency fy). The use of auxiliary loop 92 can therefore mitigate or cancel out any phase noise associated with ring oscillator 76, thus improving the overall phase noise performance of PLL circuitry 52 in a certain frequency range. Auxiliary loop 92 is therefore sometimes referred to as a phase noise cancellation loop. Auxiliary loop 92 that includes ring oscillator 76, digital-to-time converter 84, digital amplifier 86, and digital bandpass filter 88 (which are all digital circuits) can therefore sometimes be referred to collectively as a digital phase noise cancelling loop.

Figure 8:
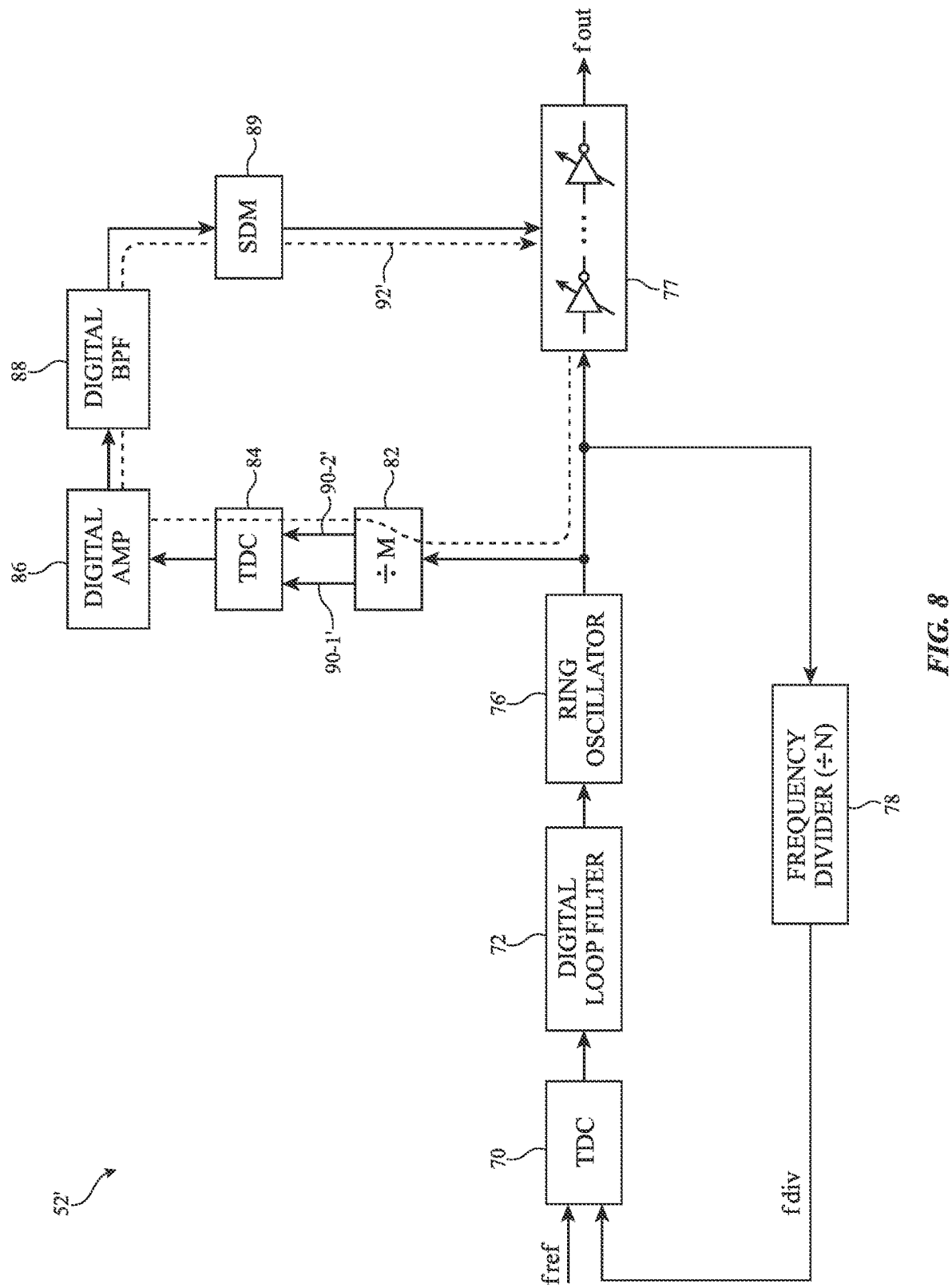
FIG. 8 is a diagram of illustrative digital phase-locked loop circuitry having a ring oscillator and an auxiliary digital loop for tuning a separate output delay chain in accordance with an embodiment.

The embodiment of FIG. 4 in which PLL circuitry 52 includes an auxiliary digital phase noise cancellation loop 92 for directly tuning variable ring oscillator 76 is illustrative. FIG. 8 shows another embodiment of PLL circuitry 52' having an auxiliary loop 92' for tuning a separate output delay chain 77. As shown in FIG. 8, PLL circuitry 52' may include a time-to-digital converter 70, a digital loop filter 72, a ring oscillator 76', and a frequency divider 78 connected in a primary phase-locked loop. Ring oscillator 76' may be a variable ring oscillator (see, e.g., tunable ring oscillator of the type shown in FIG. 5). The functionality and operation of blocks 70, 72, 76 and 78 are otherwise similar to that already described in connection with FIG. 4 and need not be reiterated in detail to avoid obscuring the present embodiment.

Ring oscillator 76' can exhibit elevated phase noise compared to conventional LC-based voltage controlled oscillators. To help reduce or suppress the phase noise of ring oscillator 76', PLL circuitry 52' may be provided with an auxiliary loop such as loop 92' shown in FIG. 8. Auxiliary loop 92' may include frequency divider 82, time-to-digital converter (TDC) 84, digital amplifier 86, digital bandpass filter 88, a sigma delta modulator such as sigma delta modulator (SDM) 89, and an adjustable delay circuit such as adjustable delay chain 77.

Frequency divider block 82 may include one or more separate frequency divider subcircuits configured to receive an oscillator signal from the output of ring oscillator 76' and configured to output a first clock signal having a first phase on a first output path 90-1' and to output a second clock signal having a second phase different than the first phase on a second output path 90-2'. Frequency divider 82 may have a frequency division ratio M that is less than frequency division ratio N of frequency divider 78. As examples, frequency division ratio N may be equal to or greater than 10 times frequency division ratio M; N may be equal to or greater than 5 times M; N may be equal to greater than 2 times M; N may be 2-20 times greater than M; N may be more than 10 times M; N may be 10-100 times M; or N may be more than 100 times M. Using a smaller division ratio M in the auxiliary loop 92' enables loop 92' to correct or cancel out the phase noise of ring oscillator 76' much faster than the correction speed of the primary PLL loop.

Time-to-digital converter 84 may receive the frequency divided clock signals from paths 90-1' and 90-2'. TDC 84 may operate as a phase detector to output a corresponding phase error signal based on the phase difference between the two received clock signals at its inputs. Digital amplifier 86 may be configured to amplify the detected phase error signal to produce an amplified phase error signal. Digital amplifier 86 may provide an amount of gain that determines the loop gain of auxiliary loop 92'. Digital bandpass filter 88 may be configured to filter the amplified phase error signal to produce a filtered phase error signal. Digital bandpass filter 88 may have a selectively bandpass filter response (see, e.g., bandpass filter response 114 shown in FIG. 6) configured to reject the thermal and quantization noise associated with time-to-digital converter 84.

Sigma delta modulator 89 may receive the filtered phase error signal from digital bandpass filter 88 and output a corresponding control signal to tune variable delay circuit 77. Variable delay circuit 77 may include a chain of inverters. The control signal output from sigma delta modulator 89 can adjust one or more tuning knobs of delay circuit 77 to adjust the delay of circuit 77. For example, the control signal can be used to tune an adjustable supply voltage of one or more inverters within circuit 77, to tune a pull-up drive strength of one or more inverters within circuit 77, to tune a pull-down drive strength of one or more inverters within circuit 77, to selectively activate and deactivate one or more inverters within circuit 77, and/or to otherwise adjust the delay of circuit 77.

Configured and operated in this way, auxiliary loop 92' can be used to reduce the phase noise of ring oscillator 76', which can help improve the phase noise performance of the overall PLL circuitry 52'. Auxiliary loop 92' is therefore sometimes referred to as a phase noise cancellation loop. Auxiliary loop 92' that includes digital-to-time converter 84, digital amplifier 86, digital bandpass filter 88, and sigma delta modulator 89 can sometimes be referred to collectively as a digital phase noise cancelling loop.

The embodiments of FIGS. 4 and 9 showing digital PLL circuitry 52 and digital PLL circuitry 52', respectively, are illustrative and are not intended to limit the scope of the present embodiments. FIG. 9 illustrates an analog implementation of a phase-locked loop such as analog PLL circuitry 52". As shown in FIG. 9, PLL circuitry 52" may include a phase frequency detection circuit such as phase frequency detector (PFD) 200, a charge pump circuit such as charge pump 202, a loop filtering circuit such as loop filter 204, a ring oscillator circuit such as variable ring oscillator 208, and a frequency division circuit such as frequency divider 210. Phase frequency detector 200 may have a first input configured to receive a reference clock signal with frequency fref, a second input configured to receive a feedback clock signal with divided frequency fdiv, and an output. Phase frequency detector 200 may compare the phase and/or frequency of the clock signals at its inputs and generate a corresponding signal that is proportional to any phase/frequency difference between the two input clock signals to adjust charge pump 202.

Charge pump 202 may have an input coupled to the output of phase frequency detector 200 and an output. Charge pump 202 may generate a higher or lower voltage at its output depending on the difference signal output from phase frequency detector 200. For example, charge pump 202 may increase its output voltage when fref is greater than fdiv and may decrease its output voltage when fref is less than fdiv, or vice versa. Loop filter 204 may have an input coupled to the output of charge pump 202 and may have an output. Loop filter 204 can be used to filter the output of charge pump 202 and to generate a control signal for adjusting ring oscillator 208. Charge pump 202 and loop filter 204 may sometimes be referred to collectively as charge pump and loop filter circuitry.

Variable ring oscillator 208 may include an input coupled to analog loop filter 204 and may include an output on which an output clock signal having output clock frequency fout is generated. PLL circuitry 52" that includes a ring oscillator such as variable ring oscillator 208 is sometimes referred to as a ring oscillator based phase-locked loop. Variable ring oscillator 208 may be implemented similar as the variable ring oscillator shown in FIG. 5.

Frequency divider 210 may have an input coupled to the output of variable ring oscillator 208 and an output coupled to the second input of phase frequency detector 200, as shown by feedback path 211. Connected in a loop in this way, phase-locked loop circuitry 52" will generate an output clock signal with frequency fout while ensuring that the phase difference between the two clock signals at the inputs of phase frequency detector 200 70 is minimized (e.g., the primary PLL loop is configured to minimize the phase difference between the reference clock signal and the feedback clock signal).

In general, the PLL output frequency fout is equal to fref*N, where N is the frequency division ratio of divider 210. For example, frequency division ratio N of divider 210 can be greater than 10, greater than 20, greater than 40, greater than 60, greater than 80, 20-100, 80-120, 60-140, or at least 100. Reference clock frequency fref may be in the Megahertz or Gigahertz frequency range (e.g., fref may be 1-10 MHz, 10-100 MHz, at least 100 MHz, 100 MHz to 1 GHz, less than 1 GH, 0.1 GHz, 0.5 GHz, 0.1-1 GHz, etc.).

A phase-locked loop implemented using a phase frequency detector (PFD), a charge pump, a loop filter, and a ring oscillator is sometimes referred to as an analog phase-locked loop. Relative to LC-based voltage controlled oscillators, ring oscillators such as ring oscillator 208 in PLL circuitry 52" can exhibit higher levels of phase noise. To help reduce or suppress the phase noise of ring oscillator 208, PLL circuitry 52" may be provided with an auxiliary loop such as loop 222 shown in FIG. 9. Ring oscillator 208 may be disposed in a forward path of the auxiliary loop 222. Auxiliary loop 222 may further include a frequency division circuit such as frequency divider 212, a time-to-digital conversion circuit such as time-to-digital converter (TDC) 214, a data converter such digital-to-analog converter (DAC) 216, an amplifier such as variable gain amplifier 218, and a filter circuit such as analog bandpass filter 220.

Frequency divider block 212 may include one or more separate frequency divider subcircuits configured to receive the PLL output clock signal having frequency fout and configured to output a first clock signal having a first phase on a first output path 213-1 and to output a second clock signal having a second phase different than the first phase on a second output path 213-2. Frequency divider 212 may have a frequency division ratio M that is less than frequency division ratio N of frequency divider 210. As an example, the frequency division ratio M of divider 82 may be equal to or less than ⅒ of the frequency division ratio N of divider 78 (e.g., division ratio N can be 100 while division ratio is equal to 10).

As other examples, frequency division ratio M can be equal to or less than % of frequency division ratio N, frequency division ratio M can be equal to or less than ⅓ of frequency division ratio N, frequency division ratio M can be equal to or less than ¼ of frequency division ratio N, frequency division ratio M can be equal to or less than ⅕ of frequency division ratio N, frequency division ratio M can be equal to or less than ⅙ of frequency division ratio N, frequency division ratio M can be equal to or less than ⅐ of frequency division ratio N, frequency division ratio M can be equal to or less than ⅛ of frequency division ratio N, frequency division ratio M can be equal to or less than ⅑ of frequency division ratio N, frequency division ratio M can be equal to or less than ⅒ to ¹⁄₂₀ of frequency division ratio N, frequency division ratio M can be equal to or less than ⅒ to ¹⁄₁₀₀ of frequency division ratio N, or ratio N can be 5-100 times or more greater than ratio M. Using a smaller division ratio M in the auxiliary loop 222 enables loop 222 to correct or cancel out the phase noise of ring oscillator 208 much faster than the correction speed of the primary PLL loop, which is set by division ratio N.

Time-to-digital converter 214 may receive the frequency divided clock signals from paths 213-1 and 213-2. TDC 214 may operate as a phase detector to output a corresponding phase error signal based on the phase difference between the two received clock signals at its inputs. Digital-to-analog converter 216 may be configured to convert the phase error signal from the digital domain to the analog domain to produce an analog phase error signal. Variable gain amplifier (VGA) 218 may be configured to amplify the analog phase error signal to produce an amplified phase error signal. Variable gain amplifier 218 may provide an adjustable amount of gain that determines the loop gain of auxiliary loop 222.

Analog bandpass filter 220 may be configured to filter the amplified phase error signal to produce a filtered phase error signal. Analog bandpass filter 220 may be configured to filter out undesired noise signals associated with time-to-digital converter 214. Analog bandpass filter 220 may have a selective bandpass filter response (see, e.g., bandpass filter response 114 shown in FIG. 6) configured to reject the thermal and quantization noise associated with time-to-digital converter 214. The signal output from circuit 220 can be used to control or adjust (tune) variable ring oscillator 208. Auxiliary loop 222 that controls or tunes variable ring oscillator 208 in this way is therefore a negative feedback loop. Configured and operated in this way, auxiliary loop 222 can be used to reduce the phase noise of ring oscillator 208, which can help improve the phase noise performance of the overall PLL circuitry 52". Auxiliary loop 222 can therefore sometimes referred to as a phase noise cancellation loop.

Figure 10:
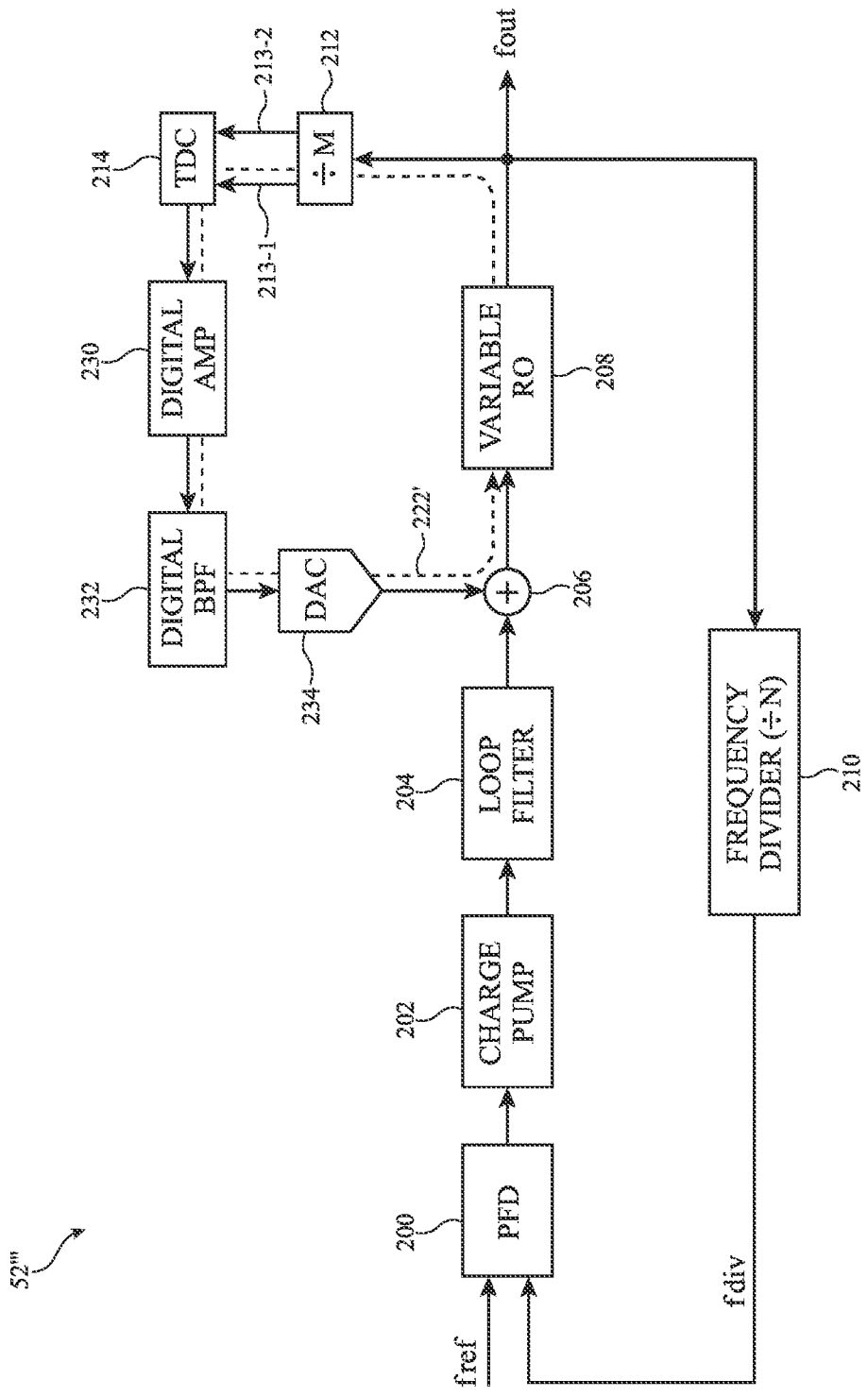
FIG. 10 is a diagram of illustrative analog phase-locked loop circuitry having a ring oscillator and an auxiliary digital loop with a digital bandpass filter in accordance with an embodiment.

The embodiment of FIG. 9 in which the auxiliary phase noise cancellation loop performs filtering in the analog domain is exemplary. FIG. 10 illustrative another embodiment of an analog phase-locked loop such as analog PLL circuitry 52''' having an auxiliary phase noise cancellation loop 222' that performs filtering in the digital domain. As shown in FIG. 10, ring oscillator 208 may be disposed in a forward path of the auxiliary loop 222'. Auxiliary loop 222' may further include a frequency division circuit such as frequency divider 212, a time-to-digital conversion circuit such as time-to-digital converter (TDC) 214, an amplifier such as digital amplifier 2308, a filter circuit such as digital bandpass filter 232, a data converter such digital-to-analog converter (DAC) 234, and an adder circuit such as adder 206.

Frequency divider block 212 may include one or more separate frequency divider subcircuits configured to receive the PLL output clock signal having frequency fout and configured to output a first clock signal having a first phase on a first output path 213-1 and to output a second clock signal having a second phase different than the first phase on a second output path 213-2. Time-to-digital converter 214 may receive the frequency divided clock signals from paths 213-1 and 213-2. TDC 214 may operate as a phase detector to output a corresponding digital phase error signal based on the phase difference between the two received clock signals at its inputs.

Digital amplifier 230 may be configured to amplify the digital phase error signal to produce an amplified phase error signal. Digital amplifier 218 may provide an adjustable amount of gain that determines the loop gain of auxiliary loop 222'. Digital bandpass filter 232 may be configured to filter the amplified phase error signal to produce a filtered phase error signal. Digital bandpass filter 232 may be configured to filter out undesired noise signals associated with time-to-digital converter 214 and to produce a corresponding filtered phase error signal. Digital bandpass filter 232 may have a selective bandpass filter response (see, e.g., bandpass filter response 114 shown in FIG. 6) configured to reject the thermal and quantization noise associated with time-to-digital converter 214.

Digital-to-analog converter 234 may be configured to convert the filtered phase error signal from the digital domain to the analog domain to produce an analog phase error signal. Adder 206 may have a first input configured to receive a filtered signal from analog loop filter 204, a second input configured to receive the analog phase error signal from data converter 234, and an output coupled to variable ring oscillator 208. Adder 206 may optionally be configured to subtract the analog phase error signal from the filtered signal received from loop filter 204. Adder 206 may therefore sometimes be referred to as a subtraction circuit or a difference circuit. Auxiliary loop 222' that controls or tunes variable ring oscillator 208 in this way is therefore a negative feedback loop. The signal output from circuit 206 can be used to control or adjust (tune) variable ring oscillator 208. Configured and operated in this way, auxiliary loop 222' can be used to reduce the phase noise of ring oscillator 208, which can help improve the phase noise performance of the overall PLL circuitry 52'''.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

What is claimed is:
1. Phase-locked loop circuitry comprising:
a first time-to-digital converter;
a digital filter coupled to an output of the first time-to-digital converter;
a ring oscillator coupled to an output of the digital filter;
a first frequency divider coupled between an output of the ring oscillator and an input of the first time-to-digital converter;
a second frequency divider coupled to the output of the ring oscillator; and
a second time-to-digital converter coupled to an output of the second frequency divider and having an output coupled to a component between the digital filter and the ring oscillator.

2. The phase-locked loop circuitry of claim 1, wherein the first frequency divider has a first division ratio and wherein the second frequency divider has a second division ratio less than the first division ratio.

3. The phase-locked loop circuitry of claim 2, wherein the second division ratio is less than a fifth of the first division ratio.

4. The phase-locked loop circuitry of claim 1, further comprising an amplifier coupled to an output of the second time-to-digital converter.

5. The phase-locked loop circuitry of claim 4, further comprising a bandpass filter coupled to an output of the amplifier.

6. The phase-locked loop circuitry of claim 5, wherein the bandpass filter has a passband configured to reject thermal and quantization noise associated with the second time-to-digital converter.

7. The phase-locked loop circuitry of claim 5, wherein the component comprises an adder having a first input coupled to the digital filter, a second input coupled to the bandpass filter, and an output coupled to the ring oscillator.

8. The phase-locked loop circuitry of claim 1, wherein the ring oscillator comprises a variable ring oscillator having an adjustable oscillation frequency.

9. The phase-locked loop circuitry of claim 1, further comprising:
an amplifier having an input coupled to an output of the second time-to-digital converter;
a bandpass filter coupled to an output of the amplifier; and
a sigma delta modulator coupled to an output of the bandpass filter.

10. The phase-locked loop circuitry of claim 9, further comprising an adjustable delay circuit having inputs coupled to the ring oscillator and the sigma delta modulator.

11. Circuitry configured to generate an oscillator signal, comprising:
a phase-locked loop having a ring oscillator and a first frequency divider with a first frequency division ratio that is used to generate the oscillator signal; and
a phase noise cancellation loop coupled to the ring oscillator and having a second frequency divider with a second frequency division ratio that is less than the first frequency division ratio.

12. The circuitry of claim 11, wherein the phase noise cancellation loop comprises:
a time-to-digital converter configured to receive signals from the second frequency divider;
an amplifier configured to amplify signals output from the time-to-digital converter; and
a bandpass filter configured to filter signals output from the amplifier.

13. Circuitry comprising:
a first loop having a first time-to-digital converter and a first frequency divider, wherein the first frequency divider has a first division ratio; and
a second loop coupled to the first loop and having a second time-to-digital converter and a second frequency divider, wherein the first and second loops share at least one circuit, and wherein the second frequency divider has a second division ratio less than the first division ratio.

14. The circuitry of claim 13, further comprising:
a variable ring oscillator coupled to an input of the first frequency divider and to an input of the second frequency divider; and
a filter coupled to an output of the first time-to-digital converter.

15. The circuitry of claim 14, wherein the at least one circuit that is shared between the first and second loops comprises an adder coupled between the filter and the variable ring oscillator.

16. The circuitry of claim 15, wherein the second frequency divider is configured to:
output a first clock signal having a first phase to a first input of the second time-to-digital converter; and
output a second clock signal having a second phase, different than the first phase, to a second input of the second time-to-digital converter.

17. The circuitry of claim 15, wherein the second loop further comprises:
a digital amplifier coupled to an output of the second time-to-digital converter.

18. The circuitry of claim 17, wherein the second loop further comprises:
a digital bandpass filter having an input coupled to the digital amplifier.

19. The circuitry of claim 18, wherein the digital bandpass filter has an output coupled to the adder.

* * * * *